United States Patent [19]
Banu et al.

[11] Patent Number: 5,608,796
[45] Date of Patent: Mar. 4, 1997

[54] BALANCED PHASE SPLITTING CIRCUIT

[75] Inventors: Mihai Banu, Murray Hill; Hongmo Wang, Watchung, both of N.J.

[73] Assignee: Lucent Technologies Inc., Murray Hill, N.J.

[21] Appl. No.: 386,578

[22] Filed: Feb. 10, 1995

[51] Int. Cl.$^6$ .................................................. H03F 3/04
[52] U.S. Cl. ...................... 379/403; 379/403; 327/254; 327/255; 327/256; 327/257
[58] Field of Search ........................... 379/403; 327/254, 327/255, 256, 257

[56] References Cited

U.S. PATENT DOCUMENTS

| 3,573,645 | 4/1971 | Wheatley, Jr. | 330/237 |
|---|---|---|---|
| 4,509,019 | 1/1983 | Banu et al. | 330/107 |
| 4,584,581 | 4/1986 | Teshirogi | 342/373 |
| 4,700,153 | 10/1987 | Salvage et al. | 333/81 R |
| 4,737,739 | 4/1988 | Roisier et al. | 333/81 R |
| 4,795,922 | 1/1989 | Rice et al. | 327/238 |
| 4,857,777 | 8/1989 | Altes | 327/255 |
| 4,896,374 | 1/1990 | Waugh et al. | 455/326 |
| 5,039,891 | 8/1991 | Wen et al. | 327/113 |
| 5,438,301 | 8/1995 | Havens et al. | 331/45 |

OTHER PUBLICATIONS

Tsukahara et al., "A 2V 2 GHz Si–Bipolar Direct–Conversion Quadrature Modulator," *IEEE ISSCC*, 40–41 (1994).
Boveda et al., "A 0.7–3 GHz GaAs QPSK/QAM Direct Modulator," Digest of Technical Papers, *IEEE ISSCC*, 142–143 (1993).

*Primary Examiner*—Krista M. Zele
*Assistant Examiner*—Gloria Tebcherani
*Attorney, Agent, or Firm*—David L. Smith

[57] ABSTRACT

Disclosed is an integrated circuit comprising a balanced set of inputs and a phase splitting circuit. The phase splitting circuit has a first input terminal that is coupled to the balanced set of inputs and a second input terminal that is coupled to the balanced set of inputs. The phase splitting circuit further comprises a balanced phase shifting network, a first set of output terminals, and a second set of output terminals. The balanced phase shifting network is coupled to the first input terminal and the second input terminal. The first set of output terminals provides a voltage representative of a first voltage across a resistive portion of the balanced phase shifting network in response to an input voltage at the balanced set of inputs. The second set of output terminals provides a voltage representative of a second voltage across a reactive portion of the balanced phase shifting network in response to the input voltage at the balanced set of inputs.

19 Claims, 2 Drawing Sheets

BALANCED PHASE SPLITTING CIRCUIT

FIELD OF THE INVENTION

The present invention relates to communications circuits. More specifically, the present invention relates to modulators and demodulators having phase splitting circuits wherein the circuits may be implemented on an integrated circuit ("IC").

BACKGROUND OF THE INVENTION

The recent rapid expansion of wireless communications has increased the desire for radio type communications circuits. The increase in cellular telephone sales/services is a prime example of expansion.

Many wireless communications circuits use phase splitters. For example, digital wireless telephone signals are transmitted at high frequencies. When a signal is received by a digital wireless telephone, the high frequency signal must be converted to a baseband signal from which bits of digital information, e.g., voice information, may be recovered. To do this, quadrature phase splitters ("splitters"), which are defined below, are used, in combination with mixers, to reduce the lowest intermediate frequency signals to the baseband signal.

Splitters are designed to receive an input signal and produce two output signals. Splitters are designed such that, for a center frequency, the two output signals are 90 degrees out of phase with each other (i.e., are in a quadrature relation with each other) and have the same magnitude. In practice, there is a range of frequencies, whose midpoint is the center frequency, for which the two output signals are considered to be in a "quadrature relation" and have the "same" magnitude. This is became some error (e.g., 89.5 degrees out of phase, magnitudes within one percent of each other, etc. . . . ) is tolerable. Thus, we will refer to the center frequency and the range of frequencies around the center frequency for which there are tolerable errors as, collectively, the center frequency.

Phase splitters may be designed with discrete components. Such a design could be implemented with two resistors ("R") and two capacitors ("C") arranged to form a high pass RC filter and a low pass RC filter. Designers could choose values for R and C such that the two output signals have equal magnitudes and are in a quadrature relation at the desired center frequency (centered about f=½πRC). If the two output signals are to exhibit these characteristics, the Rs must be the same value and the Cs must be the same value.

However, electronic manufacturers, in their desire to manufacture smaller electronic products, prefer to have circuits, including phase splitters, contained within ICs. When any circuit, including a phase splitter, is implemented on an IC, the value of, e.g., all Rs can be made the same but the value cannot be preselected due to the manufacturing process of ICs. The same is true of the value for all Cs. Further, the values for R and C may change with temperature depending upon the environment in which the electronic product containing the IC is operated. These factors result in the inability of the designer to specify the desired center frequency at which the two output signals will have both equal magnitudes and be in a quadrature relation.

In attempting to solve this problem, "A 2 V 2 GHz Si-Bipolar Direct-Conversion Quadrature Modulator" by Tsukaham et at, 1994 IEEE ISSCC, pages 40–41, describes a phase splitter that uses reverse biased diodes ("diodes") instead of capacitors. Unlike capacitors, the diodes can be externally tuned. In this case, the diodes are tuned with external DC voltages, VCI and VCQ, as shown in FIG. 3 of the reference. The need for external tuning is undesirable for a number of reasons. First, external tuning adds to the manufacturing cost of the IC. Second, externally tuned ICs are temperature sensitive. Additionally, another problem associated with using diodes is that the diodes do not exhibit the linear behavior of a capacitor. The value of a capacitor varies in proportion to the inverse of the capacitor's dielectric thickness, which is a constant thickness for a true capacitor. However, for the diodes, the dielectric thickness varies with the voltage across the device. Thus, in operation, the voltage across the diode includes an external tuning voltage (e.g., VCI and/or VCQ) and a sinusoidal signal riding on top of the external timing voltage. The sinusoidal signal varies the dielectric thickness of each of the two diodes, Q1 and Q2, giving rise to their nonlinear behavior. Because of the nonlinear behavior, even though the magnitudes of the two output signals are equal, the two output signals are no longer in a quadrature relation.

Other attempts have been made. "A 0.7–3 GHz GaAs QPSK/QAM Direct Modulator", by A. Boveda at at., Digest of Technical Papers, 1993 IEEE ISSCC, pages 142–143, discloses a splitter that uses variable resistive elements, in the form of junction field effect transistors ("JFETs") that can be externally tuned such that the two output signals are in quadrature with each other. JFETs are highly nonlinear. Thus, even though the JFETs can be externally tuned such that the two output signals are in a quadrature relation, the two output signals will no longer be of equal magnitude.

It is desirable to implement a phase splitter circuit on a single IC that exhibits little or no nonlinearity and does not have to be externally tuned while providing two output signals which, for a desired center frequency, are in a quadrature relation and have equal magnitudes.

SUMMARY OF THE INVENTION

Disclosed is an integrated circuit comprising a balanced set of inputs and a phase splitting circuit which includes a balanced phase shifting network. Advantageously, the balanced phase shifting network provides two output signals which, for a desired center frequency, are in a quadrature relation and have equal magnitudes without requiring external tuning or exhibiting large nonlinearities.

In accordance with the present invention, the phase splitting circuit has a first input terminal that is coupled to the balanced set of inputs and a second input terminal that is coupled to the balanced set of inputs. The phase splitting circuit Rather comprises the balanced phase shifting network, a first set of output terminals, and a second set of output terminals. The balanced phase shifting network is coupled to the first input terminal and the second input terminal. The first set of output terminals provides a voltage representative of a first voltage across a resistive portion of the balanced phase shifting network in response to an input voltage at the balanced set of inputs. The second set of output terminals provides a voltage representative of a second voltage across a reactive portion of the balanced phase shifting network in response, to the input voltage at the balanced set of inputs.

Other advantages of the present invention will become apparent to those skilled in the art from the detailed description and associated drawings.

DETAILED DESCRIPTION

Introduction

An electrical network may be "balanced" or "unbalanced." A balanced electrical network, such as a phase shifting network, may be a linear electrical network or a nonlinear electrical network. A linear network is a network for which superposition applies. On the other hand, in a nonlinear network, superposition does not apply.

A linear network is balanced if each node in the network either belongs to a pair of nodes whose voltage sum is a constant or is a node exhibiting a constant voltage. Each node must be able to be classified as one of these types of nodes regardless of the balanced input to the network.

A nonlinear network may be "truly" balanced or "weakly" balanced. These will now be described in order.

A nonlinear network is said to be truly balanced if each node in the network either belongs to a pair of nodes whose voltage sum is a constant or is a node exhibiting a constant voltage. Again, each node must be able to be classified as one of these types of nodes regardless of the balanced input to the network.

A nonlinear network is said to be weakly balanced if a small-signal linear network ("SSLN") model for the nonlinear network operating at a DC operating point ("DCOP") exhibits four characteristics. The DCOP of a nonlinear network is related to the set of all voltages at and currents through each node of the nonlinear network when the input signals to the network are zero and the power supplies are constant. Now, the four characteristics will be listed. First, the SSLN model must have the same number of nodes as the nonlinear network. Second, for each element in the nonlinear network there must be one and only one corresponding element in the SSLN model having the same number of inputs and the same number of outputs as the element in the nonlinear network. Third, the voltage across and the current through each corresponding element in the SSLN model is representative of the response to variation in voltage across and current through the element in the nonlinear network. Fourth, the SSLN model must be balanced in the same sense of the term as is described with respect to linear networks.

It should now be clear to those skilled in the art that it is possible to have a balanced linear network a truly balanced nonlinear network, and a weakly balanced nonlinear network. As used herein, all of these networks are considered to be "balanced" networks.

Illustrative Embodiment

Figure 1:
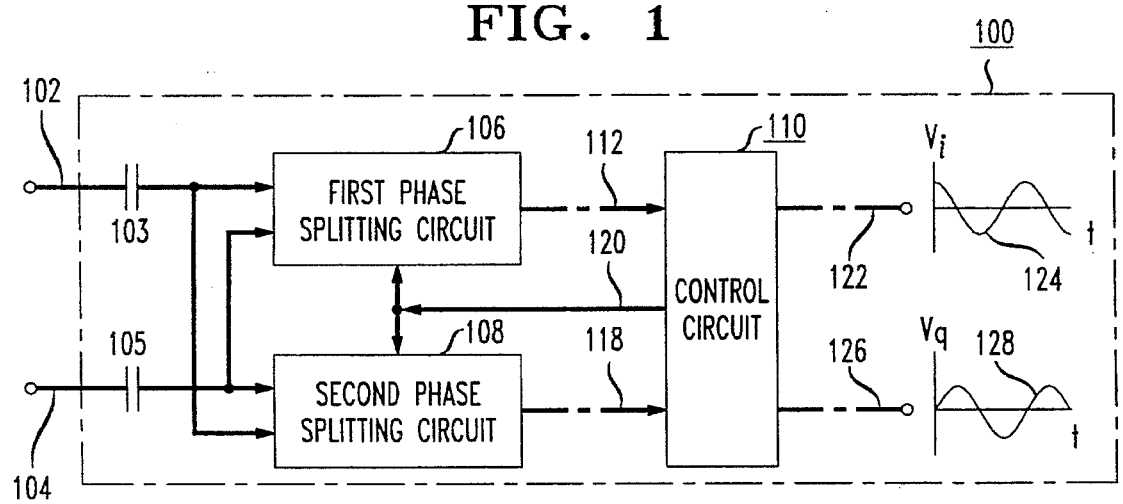
FIG. 1 shows a circuit that may be used to implement the present invention.

FIG. 1 presents an illustrative embodiment of the present invention which advantageously employs an IC comprising a balanced phase shining network that provides two output signals which, for a desired center frequency, are in a quadrature relation and have equal magnitudes without requiring external tuning or exhibiting large nonlinearities.

Referring to FIG. 1, a phase splitting circuit on an IC 100 comprises a balanced set of inputs, 102 and 104, a first phase splitting circuit 106, a second phase splitting circuit 108, and a control circuit 110, all connected as shown. A set of inputs is said to be "balanced" if the sum of the voltages on the set of inputs equals a constant. Each input in the balanced set of inputs 102 and 104 is input into the fast phase splitting circuit 106 and the second phase splitting circuit 108 via capacitors 103 and 105, as shown. The first phase splitting circuit 106 is coupled to the control circuit 110 via a fast set of output terminals 112. The second phase splitting circuit 108 is coupled to the control circuit 110 via a second set of output terminals 118. The control circuit 110 provides three outputs. A first output 120 of the control circuit 110 is coupled to the fast phase splitting circuit 106 and the second phase splitting circuit 108. The second output 122 of the control circuit 110 outputs a first output voltage signal 124. In operation, the fast output voltage signal 124 is representative of a voltage across a portion of the first phase splitting circuit 106. The third output 126 of the control circuit 110 outputs a second output voltage signal 128. In operation, the second output voltage signal 128 is representative of a voltage across a portion of the second phase splitting circuit 108. The first output voltage signal 124 and the second output voltage signal 128 are equal in magnitude, and are in a quadrature relation with each other.

Figure 2:
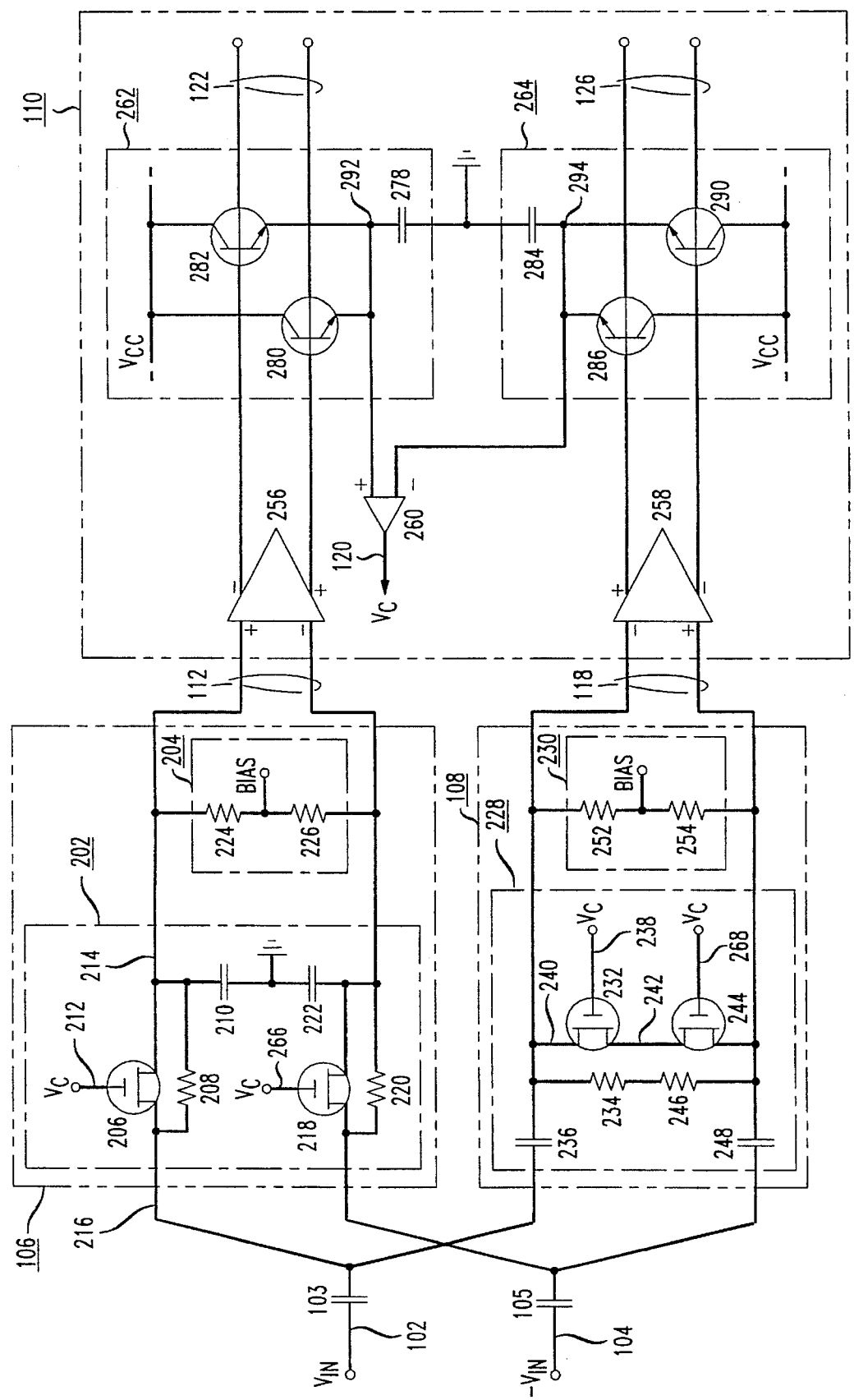
FIG. 2 shows a more detailed version of the circuit of FIG. 1.

Referring to FIG. 2, the first phase splitting circuit 106 comprises a first balanced phase shifting network 202 and a first biasing network 204. The first phase shifting network is a weakly balanced nonlinear network. The first balanced phase shifting network 202 comprises a first variable resistive element 206, preferably a metal oxide semiconductor ("MOS") device, a resistor 208, and a capacitor 210, all connected as shown. The first variable resistive element 206 is a nonlinear device and has a gate 212, a drain 214, and a source 216. It will be apparent to those skilled in the art that resistors 208 and 220 are "degeneration" resistors that aid the first variable resistive element 206 and the second variable resistive element 218, respectively, in more closely emulating linear devices. However, resistors 208 and. 220 also reduce the range of variability of the first variable resistive element 206 and the second variable resistive element 218, respectively. The first biasing network 204 comprises resistors 224 and 226 and is connected in parallel with capacitors 210 and 222. The first biasing network 204 assists in setting the DCOP of the first phase shifting network 202.

Again referring to FIG. 2, the second phase splitting circuit 108 comprises a second balanced phase shifting network 228 and a second biasing network 230. The second balanced phase shifting network is a truly balanced nonlinear network. The second balanced phase shifting network 228 comprises a first variable resistive element 232, preferably a MOS device, a resistor 234, and a capacitor 236, all connected as shown. As explained with reference to the first balanced phase shifting network 202, the fast variable resistive element 232 is a nonlinear device and has a gate 238, a drain 240, and a source 242. A second variable resistive element 244, a resistor 246, and a capacitor 248, all connected as shown, are also used to form the second balanced phase shifting network 228. The second biasing network 230 comprises resistors 252 and 254 and is connected in parallel with the first variable resistive element 232 and the second variable resistive element 244. The second biasing network 230 assists, in setting the DCOP of the second phase shifting network 228. The variable resistive elements, the resistors, and the capacitors in the first phase splitting network 106 have the same electrical characteristics, within manufacturing tolerances, as the variable resistive elements, the resistors, and the capacitors in the second phase splitting network 108, respectively.

Still referring to FIG. 2, the control circuit 110 comprises a first amplifier 256, a second amplifier 258, a third amplifier 260, a first peak detector 262, and a second peak detector 264, all connected as shown. In general, the control circuit 110 functions to provide feedback to the gates 212, 266, 238, and 268 of the first variable resistive element 206, the second variable resistive element 218, the first variable resistive element 232, and the second variable resistive element 244, respectively. The feedback provided is in the form of a control voltage, $V_c$, which is the first output 120 of the control circuit 110. Since the control voltage is identical for each variable resistor, when in operation, the second output 122 and the third output 126 of the control circuit 110 output a fast output voltage, $V_i$, and a second voltage, $V_q$, respectively, wherein $V_i$ and $V_q$ are equal in magnitude.

Again referring to FIG. 2, the first peak detector 262 comprises capacitor 278 and transistors 280 and 282 connected as shown. The second peak detector 264 comprises capacitor 284 and transistors 286 and 290 connected as shown.

Yet again referring to FIG. 2, in operation, the fast amplifier 256 and the fast peak detector 262 take the voltage across capacitors 210 and 222 and create a fast DC voltage at node 292. The second amplifier 258 and second peak detector 264 take the voltage across the fast variable resistive element 232 and the second variable resistive element 244 and produce a second DC voltage at node 294. Amplifier 260 provides feedback by amplifying the difference between the voltage at nodes 292 and 294.

Those skilled in the art will appreciate that the configuration and interconnection of elements in the first phase splitting circuit 106 and the second phase splitting circuit 108 make the fast phase splitting circuit 106 appear as a linear network for its DCOP and the second phase splitting circuit 108 appear as a linear network for its DCOP. Further, preferably, in order to achieve a balanced circuit, within manufacturing tolerances, the electrical properties of capacitors 210, 222, 236, and 248 must be identical, the electrical properties of resistors 208, 220, 234, and 246 must be identical, and the electrical properties of the first variable resistive element 206, the second variable resistive element 218, the first variable resistive element 232 and the second variable resistive element 244 must be identical.

As will be apparent to those skilled in the art, there are many variations of the embodiment described above that may be used to achieve a balanced phase splitting circuit. Some of the variations will now be described.

A fast variation involves using the first phase splitting circuit 106 without the second phase splitting circuit 108. In this case, a first output would be measured representative of the sum of the voltages across the first variable resistive element 206 and the second variable resistive element 218. The second output would be the sum of the voltages measured across capacitors 210 and 222. Those skilled in the art will appreciate that the second amplifier 258 would be coupled to the first output. Also, the second phase splitting circuit 108 could be used without the fast phase splitting circuit 106 if similar modifications were made. However, in this instance, the first output could be taken as the voltage across either capacitor 236 or capacitor 248 and the second output could be taken as the voltage across either the first variable resistive element 232 or the second variable resistive element 244. This difference in where outputs may be measured occurs because the second balanced phase shifting network 228 is a truly balanced nonlinear network whereas the fast balanced phase shifting network 202 is a weakly balanced nonlinear network.

A second variation involves using resistive elements that are not variable. In this case, resistors could be used provided that the circuit is balanced.

A third variation involves using one capacitor instead of capacitors 236 and 248. Those skilled in the art will appreciate that any number of capacitors may be used.

A fourth variation involves using only one variable resistor instead of the first variable resistive element 232 and the second variable resistive element 244. Those skilled in the art will appreciate that any number of variable resistors may be used.

A fifth variation involves using a set of variable resistors arranged, e.g., in parallel in place of any of the variable resistors wherein any number of variable resistors in the set of variable resistors may be turned on or off. Those skilled in the art will appreciate that this enables the circuit to operate for a wider range of frequencies.

A sixth variation involves using a set of capacitors arranged, e.g., in parallel in place of any of the capacitors wherein any number of the capacitors may be switched into and out of the circuit. Those skilled in the art will appreciate that this enables the circuit to operate for a wider range of frequencies.

Finally, there are two additional types of variations that will be appreciated by those skilled in the art, namely, variations to the environment of use of the invention and combinations of the above listed variations. An example of the former type of variations would involve use of the invention in environments other than cellular telephones (e.g., radio broadcasts, cable broadcast, instrumentation, imaging and/or any type of analog signal processing involving orthogonal modulation, etc. . . . ). Those skilled in the art will realize that when incorporating an IC implementing the invention into an electrical product such as a consumer product, other associated electronics and a housing for the IC and the other associated electronics may be used. An example of this would be a cellular telephone comprising a homing and electronics. The electronics comprise the IC implementing the invention. The electronics would enable the, e.g., cellular telephone to transmit, receive, and process signals. An example of the latter type of variations would involve using the first described variation in combination with the second described variation from the above paragraphs. Thus, the invention is defined by the appended claims.

What we claim is:

1. An integrated circuit comprising:

(a) a balanced set of inputs;

(b) a phase splitting circuit coupled to the balanced set of inputs at a first input terminal of the phase splitting circuit and at a second input terminal of the phase splitting circuit, the phase splitting circuit further including:

(1) a balanced phase shifting network coupled to the first input terminal and the second input terminal;

(2) a first set of output terminals for providing a first voltage across a resistive portion of the balanced phase shifting network in response to an input voltage at the balanced set of inputs; and (3) a second set of output terminals for providing a second voltage across a reactive portion of the balanced phase shifting network in response to the input voltage at the balanced set of inputs.

2. The integrated circuit of claim I wherein the balanced phase shifting network of the phase splitting circuit comprises:

(a) a first resistive element having a first terminal and a second terminal, the first terminal being coupled to the first input terminal;

(b) a second resistive element having a third terminal and a fourth terminal, the third terminal being coupled to the second input terminal;

(c) a reactive element having a fifth terminal and a sixth terminal, the fifth and sixth terminals of the reactive element coupled to the second terminal and the fourth terminal, respectively.

3. The integrated circuit of claim 2 wherein the reactive element comprises a first capacitor and a second capacitor connected in series.

4. The integrated circuit of claim 2 wherein the first resistive element is a first variable resistive element and the second resistive element is a second variable resistive element.

5. The integrated circuit of claim 4 wherein the first variable resistive element comprises a first field effect transistor and the second variable resistive element comprises a second field effect transistor.

6. The integrated circuit of claim 1 wherein the balanced phase shifting network of the phase splitting circuit comprises:

(a) a first reactive element having a first terminal and a second terminal, the first terminal being coupled to the first input terminal;

(b) a second reactive element having a third terminal and a fourth terminal, the third terminal being coupled to the second input terminal;

(c) a resistive element having a fifth terminal and a sixth terminal, the fifth and sixth terminals of the resistive element coupled to the second terminal and the fourth terminal, respectively.

7. The integrated circuit of claim 6 wherein the resistive element comprises a variable resistive element.

8. The integrated circuit of claim 6 wherein the variable resistive element comprises a field effect transistor.

9. The integrated circuit of claim 6 wherein the fast reactive element comprises a capacitor and the second reactive element comprises a capacitor.

10. An integrated circuit comprising:

(a) a balanced set of inputs;

(b) a fast phase splitting circuit comprising:
  (1) a fast balanced phase shifting network;
  (2) a fast input terminal and a second input terminal coupled to the balanced set of inputs; and
  (3) a fast set of output terminals for providing a first voltage across a reactive portion of the fast balanced phase shifting network in response to an input voltage at the balanced set of inputs;

(c) a second phase splitting circuit comprising:
  (1) a second balanced phase shifting network;
  (2) a third input terminal and a fourth input terminal coupled to the balanced set of inputs; and
  (3) a second set of output terminals for providing a second voltage across a resistive portion of the second balanced phase shifting network in response to the input voltage at the balanced set of inputs.

11. The integrated circuit of claim 10 wherein the reactive portion of the first balanced phase shifting network comprises a capacitor.

12. The integrated circuit of claim 10 wherein the resistive portion of the second balanced phase shifting network comprises a variable resistive element.

13. The integrated circuit of claim 12 wherein the variable resistive element comprises a field effect transistor.

14. The integrated circuit of claim 12 wherein the variable resistive element comprises a control terminal and wherein the integrated circuit further comprises a feedback control circuit coupled to the fast set of output terminals, the second set of output terminals, and the control terminal of the variable resistive element.

15. The integrated circuit of claim 14 wherein the fast balanced phase shifting network comprises a second variable resistive element having a second control terminal and wherein the feedback circuit comprises:

(a) a first amplifier for providing a second output, the fast amplifier being coupled to the fast set of output terminals of the first phase splitting circuit;

(b) a second amplifier for providing a third output, the second amplifier being coupled to the second set of output terminals of the second phase splitting circuit;

(c) a fast peak detector coupled to the first amplifier;

(d) a second peak detector coupled to the second amplifier; and (e) a third amplifier coupled to the fast peak detector and the second peak detector, a fast output of the third amplifier being coupled to the control terminal and the second control terminal.

16. A communications device comprising:

(a) a housing; and (b) circuit means for processing signals, the circuit means comprising an integrated circuit, the integrated circuit: comprising:
  (1) a balanced set of inputs; and
  (2) a phase splitting circuit coupled to the balanced set of inputs at a fast input terminal of the phase splitting circuit and at a second input terminal of the phase splitting circuit, the phase splitting circuit further comprising:
    (i) a balanced phase shifting network coupled to the first input terminal and the second input terminal;
    (ii) a first set of output terminals for providing a first voltage across a resistive portion of the balanced phase shifting network in response to an input voltage at the balanced set of inputs; and
    (iii) a second set of output terminals for providing a second voltage across a reactive portion of the balanced phase shifting network in response to the input voltage at the balanced set of inputs.

17. The communications device of claim 16 wherein the communications device is a cellular telephone.

18. A communications device comprising:

(a) a housing and (b) circuit means; for processing signals, the circuit means comprising an integrated circuit, the integrated circuit comprising:
  (1) a balanced set of inputs;
  (2) a first phase splitting circuit comprising:
    (i) a first balanced phase shifting network;
    (ii) a first input terminal and a second input terminal coupled to the balanced set of inputs; and
    (iii) a first set of output terminals for providing a first voltage across a reactive portion of the first balanced phase shifting network in response to an input voltage at the balanced set of inputs;
  (3) a second phase splitting circuit comprising:
    (i) a second balanced phase shifting network;
    (ii) a third input terminal and a fourth input terminal coupled to the balanced set of inputs; and
    (iii) a second set of output terminals for providing a second voltage across a resistive portion of the second balanced phase shifting network in response to the input voltage at the balanced set of inputs.

19. The communication device of claim 18 wherein the communications device is a cellular telephone.

* * * * *